United States Patent [19]
Glass

[11] Patent Number: 5,619,543
[45] Date of Patent: Apr. 8, 1997

[54] DIGITAL PHASE-LOCKED LOOP FILTER

[75] Inventor: William Glass, Seyssinet-Pariset, France

[73] Assignee: SGS-Thomson Microelectronics S.A., Saint Genis Pouilly, France

[21] Appl. No.: 298,559

[22] Filed: Aug. 30, 1994

[30] Foreign Application Priority Data

Aug. 31, 1993 [FR] France ................. 93 10578

[51] Int. Cl.⁶ ................. G03D 3/24; H04B 1/10
[52] U.S. Cl. ................. 375/376; 375/350
[58] Field of Search ................. 375/327, 343, 375/350, 376, 231–232; 364/724.01; 327/147, 156; 370/72, 123

[56] References Cited

U.S. PATENT DOCUMENTS

| | | | |
|---|---|---|---|
| 4,462,108 | 7/1984 | Miller | 375/327 |
| 5,093,847 | 3/1992 | Cheng | 375/327 |
| 5,146,470 | 9/1992 | Fujii et al. | 375/350 |
| 5,230,012 | 7/1993 | Schenk | 375/362 |
| 5,268,936 | 12/1993 | Bernardy | 375/376 |
| 5,291,144 | 3/1994 | Ichiyoshi | 375/376 |
| 5,343,496 | 8/1994 | Honig et al. | 375/350 |

FOREIGN PATENT DOCUMENTS 3532857  3/1985  Germany ............. H03H 17/06

*Primary Examiner*—Young T. Tse
*Attorney, Agent, or Firm*—David M. Driscoll; James H. Morris; Brett N. Dorny

[57] ABSTRACT

A digital phase-locked loop filter in which the incoming error signals are subject to at least one multiplication by a filtering coefficient before being digitally processed at each clock pulse to provide a filtered signal. The PLL filter includes a circuit which decrements the value of the filtering coefficients at each clock pulse during an initial operation period of the filter.

6 Claims, 2 Drawing Sheets

DIGITAL PHASE-LOCKED LOOP FILTER

BACKGROUND OF THE INVENTION

1. Field of the Invention

The present invention relates to the fabrication of filters used in digital phase-locked loops (PLLs), and, more particularly, with relation to the application of such a phase-locked loop in a carrier recovery system of a modem coupled to a telephone line.

2. Discussion of the Related Art

The book "Digital Communication" by E. A. Lee and D. G. Messerschmitt, Kluwer Academic Publishers, fourth edition, 1992 describes phase-locked loops and their application to modems. More particularly, the operation of such phase-locked loops are described in chapter 14 of this book entitled "Carrier Recovery", pp. 548–557. Drawings 14-2 and 14-6 are duplicated in FIGS. 1 and 2.

As assumed in chapter 14, in application of phase-locked loops according to the present invention, the sampling clock, or symbol or baud clock, is assumed to have a known frequency. The phase-locked loop is designed to accurately recover the carrier frequency by taking into account only frequency shifts and phase jitters.

To achieve this purpose, the input circuits of a modem determine, at each sampling clock pulse, a complex signal from the analog signal received on the telephone line. If the transmission is free of defect, the complex signal corresponds to an emitted symbol. As represented in FIG. 1, this complex signal is applied to the input of a phase detector 1 and more particularly to a first input of a multiplier 2. The output of multiplier 2 is provided to the first input of an angle measurement device 3 and to the input of a decision circuit 4. The second input of the angle measurement device 3 is provided by the output of the decision circuit 4, which approximates, from stored tables, the phase and the amplitude of the symbol presenting the closest characteristics with respect to the received symbol. The angle measurement device determines the difference or the angle error $\epsilon_k$ between the received symbol and the approximated symbol and uses this difference to lock a complex oscillator or VCO 5 providing a complex signal that will be used to "demodulate" the input signal in the multiplier 2. A loop filter 6 is provided between the angle error measurement device 3 and the input of the complex VCO 5. The difference between this device and a conventional phase-locked loop lies in that the reference signal is an estimation provided by the decision circuit 4 instead of being externally provided.

FIG. 14-6 of the above-mentioned book, duplicated in the attached FIG. 2, is an exemplary implementation of the circuit of FIG. 1. This circuit, in which conventional mathematic notations designate real and imaginary parts, will not be described in detail. It should only be noted that in the lower right-hand portion of the figure, an exemplary suitable filter is represented. In this case, the filter is of the integral type including a multiplier for multiplying the error signal by a constant $K_L$. At each clock pulse, the multiplier output is added to the content of a register $z^{-1}$. So, at the output of the register a cumulated error, which corresponds to an error integration, is obtained.

A problem encountered with filters that are used in this particular application and more generally with PLL filters is that, during initialization, for example during the initial training or handshake procedure between two modems, one must rapidly compensate for an error that may be important. In contrast, once the initial correction has been carried out, for example while a modem is communicating, the phase no longer varies significantly. So, it is desired, during the initial phase, to use a relatively high coefficient $K_L$ to ensure fast control; then, once the communication is established, to decrease coefficient $K_L$ (and more generally the filtering coefficients K) to carry out small corrections and to ignore high instantaneous variations normally corresponding to non-repetitive parasitic pulses.

So, digital PLLs, in which the filtering coefficients are switched between a high initial value and a lower steady state value, have already been provided in the prior art.

However, this rather abrupt switching of the filtering coefficients K, that substantially correspond to the time constant of an analog filter, can cause loops to be locked off. This is a particular problem in modem applications where other adaptive algorithms operate in parallel in a convergent way.

SUMMARY OF THE INVENTION

To avoid this drawback, the present invention provides a digital PLL filter in which the filtering coefficients are regularly decremented at each clock pulse between an initial value and an end value.

The present invention more precisely provides for linearly decrementing these filtering coefficients at each clock pulse even if this linear decrementation does not correspond to a linear variation of the filter bandwidth.

More particularly, the invention applies to a digital filter of the proportional-integral type.

According to an embodiment of the present invention, the means for linearly decrementing a coefficient include a register containing the current value of the coefficient; means for initially loading an initial value in this register; means for subtracting, at each clock pulse, an increment from the content of the filter; means for comparing the current value of the filter with an end value, and means for interrupting the decrementation system when the current value of the coefficient has reached the minimum value.

The foregoing and other objects, features, aspects and advantages of the invention will become apparent from the following detailed description of the present invention when taken in conjunction with the accompanying drawings.

DETAILED DESCRIPTION OF PREFERRED EMBODIMENTS

Figure 1:
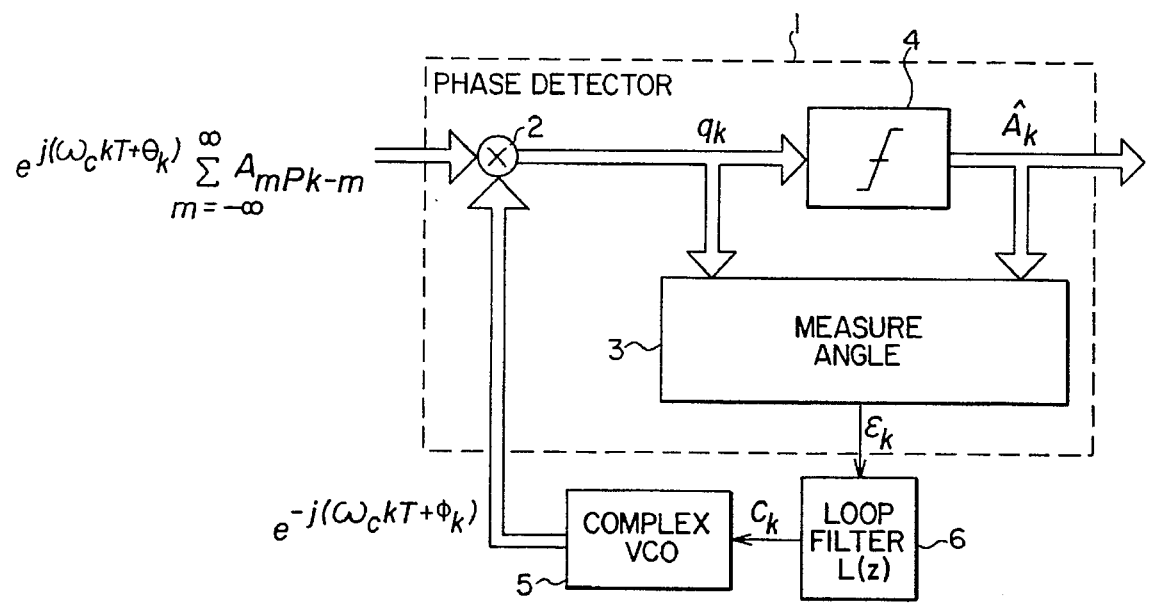
FIGS. 1 and 2, described above, correspond to FIGS. 14-2 (page 551) and 14-6 (page 554) of the above book by Lee and Messerschmitt.
Figure 2:
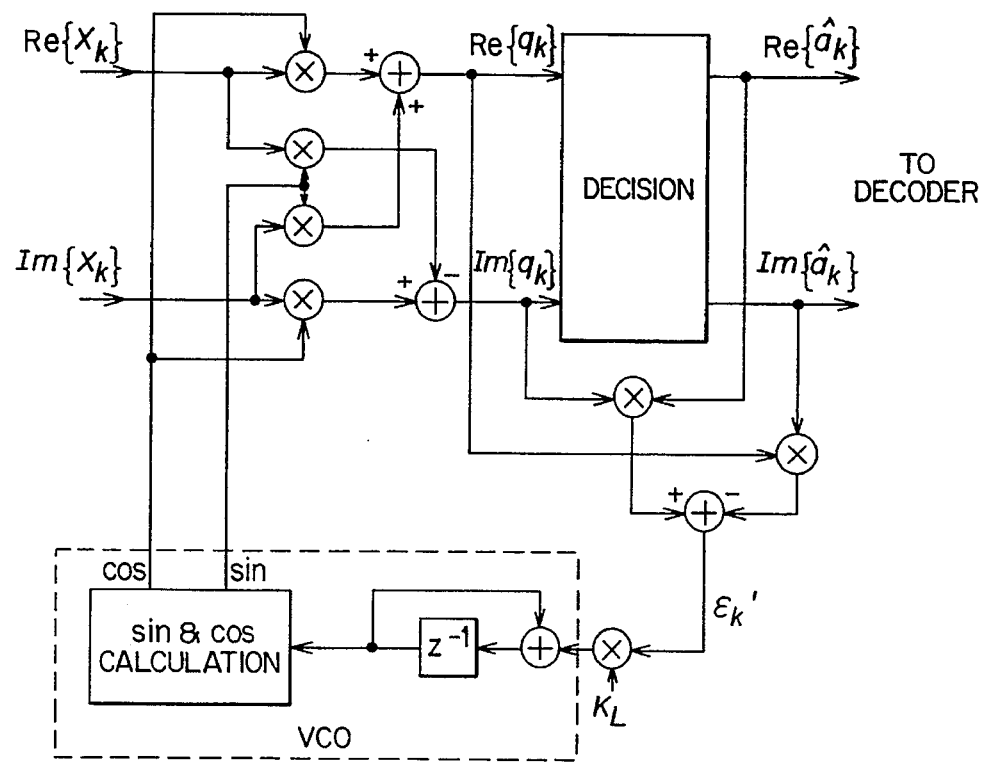
Figure 3:
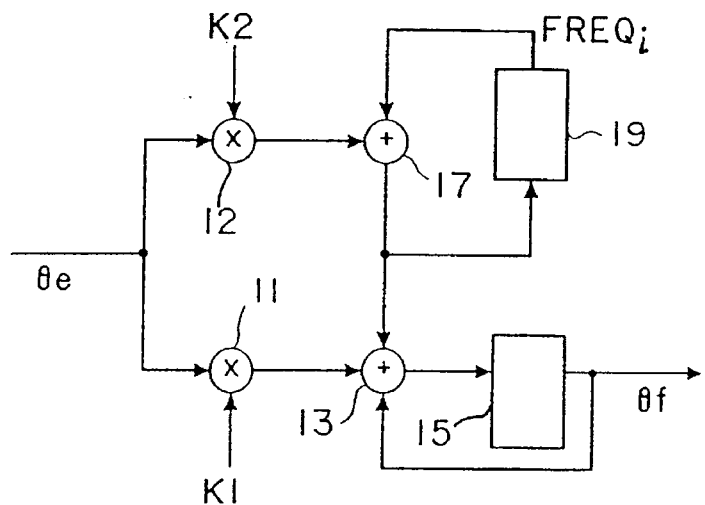
FIG. 3 represents an exemplary filter to which the present invention can be applied.

FIG. 3 represents a digital filter of the proportional-integral type constituting an exemplary digital PLL filter to which the present invention applies. The filter input receives an error signal, for example an angle error $\Theta_e$ (corresponding to $\epsilon_k$ in FIG. 1). This error signal is transmitted to two multiplying circuits 11 and 12 carrying out multiplications by coefficients K1 and K2, respectively. The output of multiplier 11 is provided to a first input of an adder 13 having its output provided to a register or memory cell 15. The output of multiplier 12 is applied to a first input of an adder 17 whose output is fed back on its second input through a register 19 and is also provided to a second input of adder 13. The output of register 15 is applied to a third input of adder 13.

Input $\Theta_e$ is, for example, a 16-bit number, the outputs of multipliers 11 and 12 are 32-bit numbers and the output of the register or memory cell 15 is a 16-bit number. Registers 15 and 19 are timed at the clock rate of the system, the baud clock for a modem. At each clock pulse, registers 15 and 19 provide their content to the adders and replace this value with the new value provided at their input.

$FREQ_i$ is the error integrated at a clock time $t_i$ in register 19. This error can be considered as a frequency error. $\Theta f_i$ designates the filtered error stored in register 15 at this time.

Thus, at time $t_i$:

$\Theta f_i = \Theta f_{i-1} + K1.\Theta e_{i-1} + FREQ_{i-1}$ $FREQ_i = FREQ_{i-1} + K2.\Theta e_{i-1}$.

As known, in such a proportional-integral filter, the values of K1 and K2 define the bandwidth of the filter.

The present invention modifies, within a predetermined number of sampling periods, the filter bandwidth by modifying each coefficient K1, K2 at each clock pulse. In the case of the above-described filter, the coefficients must be decreased at each clock pulse if the filter bandwidth is to be decreased.

Figure 4:
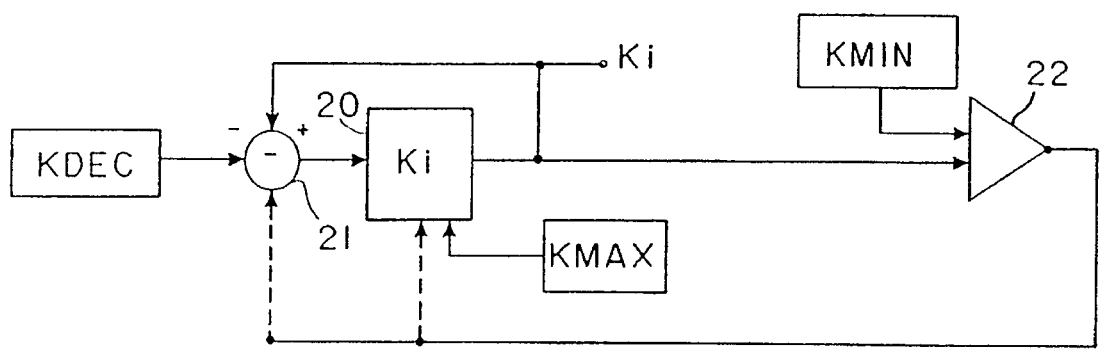
FIG. 4 represents an exemplary circuit for adjusting the filtering coefficient according to the present invention.

A circuit for decreasing the value of a filtering coefficient K, is illustrated in FIG. 4. Such a circuit would be used for each coefficient on the filter. At an initial time, an initial value KMAX of a coefficient K is introduced into a register or memory cell 20. The output of register 20 is provided to an adding input of a subtracter 21 whose subtracting input receives a decrementing value KDEC of coefficient K. Accordingly, there is, at time i, at the output of register 20 a value $Ki = KMAX - i \times KDEC$.

The value is applied as a coefficient input to one of the multipliers 11, 12 of FIG. 3. The output Ki is applied to a comparator 22 that compares this current value with a minimum value KMIN. When value Ki reaches value KMIN, the output of comparator 22 inhibits the operation of the loop 20, 21 and value Ki remains fixed at value KMIN.

Of course, the circuit illustrated in FIG. 4 constitutes only an exemplary embodiment of a circuit for decrementing a digital value. A plurality of other hardware and/or software means can be used to achieve this function.

According to an aspect of the invention, it is advantageous to use a process similar to the one illustrated in FIG. 4, in which the decrementation of coefficients is a linear decrementation. It should be noted that a linear decrementation of coefficients K1 and K2 does not necessarily cause the filter bandwidth to be linearly decremented. In the case of a proportional-integral filter, as shown in FIG. 3, to obtain a linear decrementation of the filter bandwidth, the coefficient K1 is linearly decremented, and the coefficient K2 is decremented in accordance with a function of higher order. For example, if the decrementation is performed within 500 clock pulses in the case of a modem having a 2400 Hz-sampling frequency and a carrier frequency close to 1800 Hz, the initial values of K1 and K2 are $5.4 \times 10^{-2}$ and $1.5 \times 10^{-3}$, respectively, with a 10-Hz filter bandwidth. K1 and K2 are reduced to $3.7 \times 10^{-3}$ and $6.8 \times 10^{-6}$ for a bandwidth of approximately 1 Hz. With a linear decrementation, at the 250th clock pulse, K1 would have a value of $2.9 \times 10^{-2}$ and K2 would have a value of approximately $4.3 \times 10^{-4}$. With a non-linear decrementation causing the bandwidth to linearly decrease, the same value for K1 would be obtained at the 250th clock pulse, but a value for K2 of substantially $7.4 \times 10^{-4}$ would be obtained.

In practice, a linear approximation does not substantially modify the loop convergence. This result is important since an object of the present invention is to achieve a loop whose convergence is progressive and compatible with the convergence of other modem adaptive algorithms, for example loops used with relation to systems for jitter elimination.

The present invention has been explained in connection with two specific examples: a carrier recovery loop for use in modems, and a filter of the proportional-integral type. The present invention similarly applies to other loops (such as echo cancelling and clock recovery loops) and to other types of-filters. It will be understood that in distinct filters such as higher order filters, some of the filtering coefficients may increase instead of decrease, to decrease the bandwidth. The invention will correspondingly apply to such filters, its main aspect being the modification, at each clock pulse, of the filtering coefficients between an initial value and an end value.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not in tended to be limiting. The invention is limited only as defined in the following claims and the equivalents thereto.

What is claimed is:

1. A circuit for modifying a value of a coefficient of a digital phase-locked loop filter, said circuit comprising:

a register having said value of said coefficient; initiation means for setting an initial value in said register;

modifying means for changing the value in said register at each clock pulse; and termination means for preventing operation of said modifying means.

2. The circuit of claim 1, wherein said termination means prevents operation of said modifying means when the value in said register is substantially equal to a predetermined value.

3. The circuit of claim 1, wherein said modifying means includes a subtractor.

4. The circuit of claim 1, wherein said value in said register is modified from said initial value to an end value, and wherein the initial and end values are selected so that the filter has predetermined initial and final bandwidths.

5. The circuit of claim 1, wherein said modifying means includes linear decrementation means for linearly decrementing the value in said register.

6. The circuit of claim 5, wherein said linear decrementation means includes:

means for subtracting a decrementation value from the value in said register, at each clock pulse;

means for comparing the register value with a minimum value; and means for interrupting operation of the means for subtracting when the register value is substantially equal to the minimum value.

* * * * *